United States Patent [19]

Ono et al.

[11] 4,212,021
[45] Jul. 8, 1980

[54] LIGHT EMITTING DEVICES

[75] Inventors: Yuichi Ono, Tokyo; Mitsuhiro Mori, Kokubunji; Makoto Morioka; Kazuhiro Ito, both of Tokyo; Masahiko Kawata, Yokohama; Kazuhiro Kurata, Hachioji, all of Japan

[73] Assignee: Hitachi, Ltd., Japan

[21] Appl. No.: 41,318

[22] Filed: May 22, 1979

Related U.S. Application Data

[63] Continuation of Ser. No. 817,681, Jul. 21, 1977, abandoned.

[30] Foreign Application Priority Data

Jul. 21, 1976 [JP] Japan .................................. 86037/76

[51] Int. Cl.$^2$ ............................................. H01L 33/00
[52] U.S. Cl. .......................................... 357/17; 357/18; 357/55
[58] Field of Search .................... 357/17, 18, 55, 30

[56] References Cited

U.S. PATENT DOCUMENTS

| | | | |
|---|---|---|---|
| 3,984,262 | 10/1976 | Burnham | 148/172 |
| 4,010,483 | 3/1977 | Liu | 357/17 |
| 4,017,881 | 4/1977 | Ono | 357/18 |

Primary Examiner—Martin H. Edlow
Attorney, Agent, or Firm—Craig & Antonelli

[57] ABSTRACT

In a prior-art injection type light emitting device which is constructed so that a predetermined range of a p-n junction formed by a semiconductor substrate and an epitaxial layer provided thereon may radiate, a radiation region in the p-n junction becomes larger in area than the region into which current is introduced, on account of the current spreading phenomenon. The construction of a light emitting device free from the phenomenon and a method for manufacturing the light emitting device are disclosed.

10 Claims, 12 Drawing Figures

LIGHT EMITTING DEVICES

This is a continuation of application Ser. No. 817,681, filed July 21, 1977.

FIELD OF THE INVENTION

This invention relates to high radiance light emitting devices for light emitting devices for optical communications, and methods for manufacturing them. More particularly, it relates to light emitting devices which have a structure permitting a highly efficient coupling with an optical fiber, and methods for manufacturing them.

DESCRIPTION OF THE PRIOR ART

Figure 1:
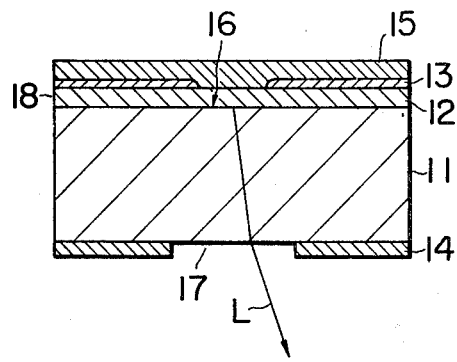
FIG. 1 is a vertical sectional view of a prior-art light emitting device.

A known light emitting device as a light emitting diode for optical communication is described in 'Material of the Society for Researchers in Light Quantum Electronics, OQE 75-71' published by the Institute of Electrical Communication in 1975 in Japan. More specifically, as illustrated in FIG. 1, on a semiconductor substrate 11 having a bandgap wider than that of a radiation region, an epitaxial layer 12 of the opposite conductivity type to that of the substrate 11 is grown. Thereafter, a glass film layer for current confinement 13 is provided in such a manner that a hole is located at the central part of the layer 12. Further, ohmic contacts 14 and 15 are provided on the bottom of the substrate and on the glass film layer 13, respectively. A p-n junction 16 is formed by the substrate 11 and the epitaxial layer 12. In this case, radiated light produced in the p-n junction 16 is introduced into an optical fiber (not shown) from a window for light extraction 17 as indicated by arrow L.

Another prior-art device is disclosed in Japanese Patent Application Public-disclosure No. 159688/1975. It includes a semiconductor substrate which is made of a material having a first bandgap, and an epitaxial layer which is made of a semiconductor material having a second bandgap wider than the first one. The substrate and the epitaxial layer have the same conductivity type. A p-n junction is formed by diffusing Zn from the outside surface of the epitaxial layer so as to get into the semiconductor substrate beyond the epitaxial layer.

Of these prior-art devices, the first is disadvantageous in that the area, determined by the glass film layer, for current confinement and the region from which light radiates do not correspond in size, the radiation region being larger due to the "current spreading phenomenon." Since the p-n junction 16 gets to a cloven side surface 18, it touches the external air and causes the nonradiative recombination due to a surface recombination current, so that the external efficiency is low. Further, the semiconductor substrate 11 exhibiting the wider bandgap has a low carrier concentration in the order of $10^{18}$ cm$^{-3}$ for a reason in the preparation of a crystal and its ohmic contact resistivity with the electrode layers 14, 15 is comparatively high, so that the energy efficiency in the case of the coupling with the optical fiber is lowered.

In the second prior-art device, the surface recombination current is suppressed by the localized p-n junction owing to the Zn diffusion. In general, however, a diffused junction is inferior to a grown junction by LPE in the perfectness of a crystal of a radiation region. Consequently, the external efficiency of this device is low. Another disadvantage is that the life of this device is shorter than that of the device with the grown junction.

SUMMARY OF THE INVENTION

This invention has for its objects to provide a light emitting device having a structure for eliminating the phenomenon in which the area of a radiation region becomes larger than the area to be determined by a glass film for current confinement, and to provide a method of manufacturing such device.

The subject matters of this invention reside in a light emitting device comprising a III-V compound semiconductor substrate whose bandgap is wider than that of a radiation region and which has a certain conductivity type, a layer of a second III-V compound semiconductor which is deposited on the upper surface of the III-V compound semiconductor substrate and which has the opposite conductivity type to that of the substrate, a current control layer which is deposited on the upper surface of the layer of the second III-V compound semiconductor and which has a hole for current flow, said current control layer being a layer of high carrier concentration or low resistivity as has the same conductivity type as that of the III-V compound semiconductor substrate, an ohmic contact which is provided on the upper surfaces of the layer of high carrier concentration or low resistivity and the layer of the second III-V compound semiconductor, and an ohmic contact which is provided on the bottom side of the III-V compound semiconductor substrate; and in a method wherein such light emitting device is manufactured by the liquid or vapor phase epitaxial growth and wherein the layer of high carrier concentration or low resistivity is formed by the diffusion process.

In this invention, the junction for radiation is not a diffused junction but it is formed by the liquid or vapor phase epitaxial growth, and besides, the regional confinement for the junction is done by the reverse-bias effect of the p-n junction. Further, the ohmic contact region of the III-V compound semiconductor having the wider bandgap is put into a sufficiently high carrier concentration so as to lower its contact resistivity with the ohmic contact. The portion of a window for radiation extraction is doped with no impurity and is left at a low carrier concentration, thereby to reduce the internal absorption of light. Thus, a light emitting device which exhibits excellent characteristics especially as a light emitting diode for communications employing an optical fiber can be obtained.

Hereunder, embodiments of this invention will be described.

DESCRIPTION OF THE PREFERRED EMBODIMENTS

Embodiment 1

Figure 2:
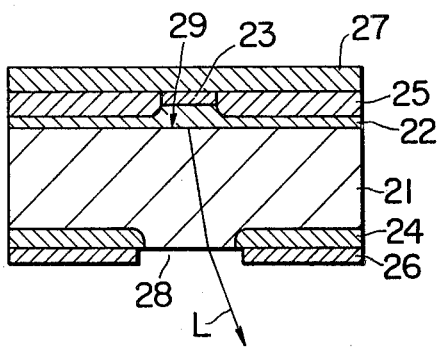
FIG. 2 is a vertical sectional view of an embodiment of the light emitting device of this invention.

FIG. 2 shows an embodiment of the light emitting device according to this invention. In the figure, numeral 21 designates a crystal layer for light transmission which is formed of a p-conductivity type layer having a bandgap wider than that of a radiation region. Numerals 22 and 23 designate n-type and n+-type crystal layers, respectively, which are successively and continuously grown on the crystal layer 21. Numerals 24 and 25 indicate selective diffusion layers of Zn which are formed in the p-type crystal layer 21 and in the n-type crystal layer 22 and n+-type crystal layer 23, respectively. The Zn diffused layer 24 exhibits a low contact resistivity to an electrode layer 26. The Zn diffused layer 25 exhibits a low contact resistivity to an electrode layer 27, and acts on a p-n junction 29, to be described below, so as to confine the p-n junction current. The ohmic contact electrode layers for the p-type and n-type, 26 and 27 are made of a metal. Shown at 28 is a window for extracting radiation indicated by arrow L, and an optical fiber (not shown) is attached to this portion. The p-n junction 29 is formed by the liquid phase epitaxial growth. By controlling the diffusion depth of the Zn diffused layer 25 in the n-type crystal layer 22 and the n+-type crystal layer 23, the radiation region can be formed into a size corresponding to the size of the extracting window 28.

In this manner, according to this invention, the Zn layer 25 is diffused in the n-type crystal layer 22 and the n+-type crystal layer 23, and the diffusion depth is controlled, whereby the radiation region is confined to a small area of the p-n junction 29 as explained later, making it possible to attain light emission of very high radiance. The surface of the electrode layer for the n-type ohmic contact, 27 is so formed as to become flat without any unevenness over the n+-type crystal layer 23 and the Zn diffused layer 25 in order that the electrode layer may efficiently radiate heat in close contact with a heat sink (not shown).

Figure 3:
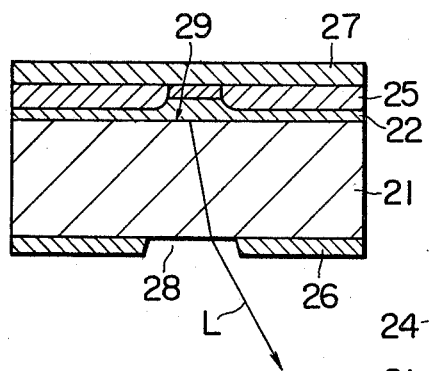
FIG. 3 is a vertical sectional view of another embodiment of the light emitting device of this invention.

In the light emitting device of embodiment, the electrode 26 may be disposed on the bottom of the p-type crystal layer 21 directly without providing the Zn diffused layer 24, as shown in FIG. 3.

Figure 4:
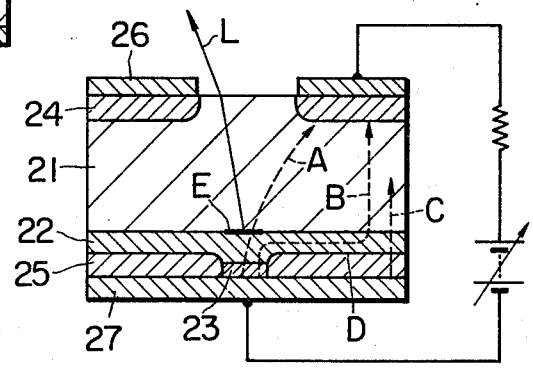
FIG. 4 is a view for explaining the operation of the radiation region confinement according to the light emitting device of this invention.

It will now be explained that, with the structure according to this invention as described above, the current flow region is confined to a specific part only, the radiation being done from the small area of the p-n junction. FIG. 4 shows current paths in the case of applying a voltage to the light emitting device shown in FIG. 2. There can be considered three cases where electrons starting from the electrode layer for the n-type ohmic contact, 27 travel along arrows of broken lines A, B and C. Here, when the electrons flow over a long distance in the n-type crystal layer 22 as indicated by the arrow B, the resistance is much higher than in the case where they flow along the arrow A. Therefore, the number of the electrons flowing as indicated by the arrow B is almost zero. Since the p-n junction D between the n-type crystal layer 22 and the p-type Zn diffused layer 25 is reverse-biased, current flow is restricted to passage through only a small portion E in the p-n junction 29 as shown in FIG. 4 when the light emitting device is forward biased, so that light of high radiance is emitted from the portion E as indicated by arrow of solid line L.

The n+ crystal layer 23 provided on the n-type crystal layer 22, as shown in FIG. 2 and FIG. 3, can be omitted with an n-type crystal layer then being substituted for the n+ crystal layer.

As apparent from the above description, the light emitting device of this invention simultaneously solves the problems of the prior arts, i.e., the current spreading phenomenon of the radiation region, the lowering of the external efficiency ascribable to the surface recombination current, and the disadvantages of short life, low reliability, etc.

EMBODIMENT 2

An example of the manufacturing process of the light emitting device of this invention will now be described with reference to FIGS. 5a–5e.

Figure 5A:
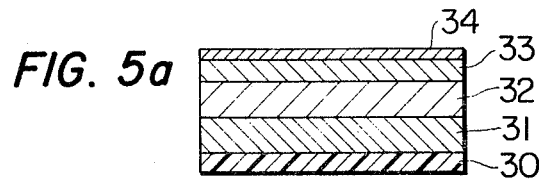
FIGS. 5a–5e are process diagrams showing an embodiment of a manufacturing method for the light emitting device of this invention.

As shown in FIG. 5a, on a III-V compound semiconductor substrate doped with an impurity bestowing a predetermined conductivity type, for example, an n-type or p-type (1 0 0) GaAs substrate 30 whose carrier concentration is in the order of $10^{17}$ cm$^{-3}$, $Ga_{1-x}Al_xAs$ 31 ($0<x\leq1$) which is about 200 μm thick is grown by the liquid phase epitaxial growth so that, by way of example, the value x may continuously decrease from 0.4 to 0.1 upwards from the substrate surface. Subsequently, the grown layer is polished until the AlAs composition of its upper surface becomes above 15% (above x=0.15), and it is put into the mirror surface state. According to a Capacitance-Voltage measurement, the carrier concentration of the crystal layer 31 was $5\times10^{17}$ cm$^{-3}$. At the next step, using the crystal layer 31 as a substrate and by a sliding method employing a graphite jig, a first layer 32 (p-type $Ga_{1-x}Al_xAs$ layer, $0<x\leq1$), a second layer 33 (n-type $Ga_{1-x}Al_xAs$ layer, $0<x\leq1$) and a third layer 34 (n+-type $Ga_{1-x}Al_xAs$ layer, $0<x\leq1$) are successively and continuously crystal-grown from a Ga solution (in which GaAs or Al is used as a solute, and Zn or Si being a p-type bestowing impurity or Te being an n-type bestowing impurity is used as a dopant).

At this time, the thicknesses of the first layer 32, the second layer 33 and the third layer 34 were, for example, about 30 μm, 2 μm and 1 μm, respectively. The carrier concentrations of the respective layers are controlled by the quantities of addition of the dopants Zn, Si and Te, and were, for example, $2-3\times10^{18}$ cm$^{-3}$, $1\times10^{18}$ cm$^{-3}$ and $5\times10^{18}$ cm$^{-3}$.

Figure 5B:
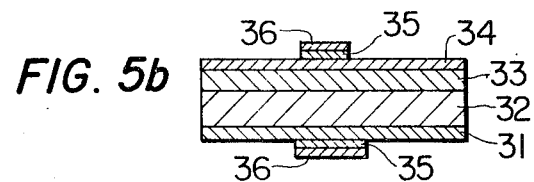

Subsequently, as shown in FIG. 5b, parts of the substrate 30 and the crystal layer 31 are polished and removed so that the total thickness may become 150 μm, and the exposed surface of the crystal layer 31 is finished into a mirror surface. Thereafter, an $Al_2O_3$ film 35 and a PSG (Phospho-Silicate-Glass) film 36 which are 1000 Å and 2000 Å thick respectively are deposited on each of the front and rear surfaces of the resultant structure. Next, the outer peripheral parts of the films 35 and 36 are removed (when the device of FIG. 3 is to be produced, the films 35 and 36 are deposited entirely on the bottom surface), to form a diffusion mask of a diameter of 40 μm on the side of the third layer 34 and a diffusion mask of a diameter of 150 μm on the side of the crystal layer 31.

Figure 5C:
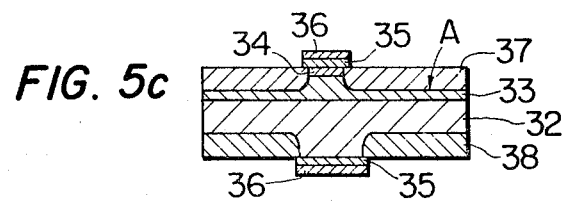

Thereafter, the resultant structure is vacuum-sealed into a quartz ampoule together with a ZnAs$_2$ source, and Zn diffused layers 37 and 38 being about 2.5 µm thick as shown in FIG. 5c are formed by a heat treatment at 650° C. for 120 minutes (when the device of FIG. 3 is to be fabricated, the glass layer except the light extracting portion at the bottom of the substrate is removed in advance). At this time, the spacing between the diffusion surface A of the Zn diffused layer 37 and the first layer 32, that is, the thickness of the second layer 33 at this part is about 0.5 µm.

Figure 5D:
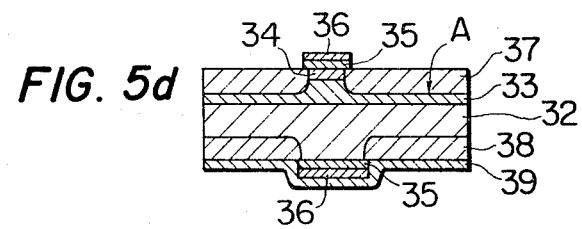

Subsequently, as shown in FIG. 5d, using the films 35 and 36 as an evaporation mask, AuZn or AuSbZn to become an ohmic contact electrode layer on the p-side, 39 is evaporated to a thickness of about 2 µm.

Figure 5E:
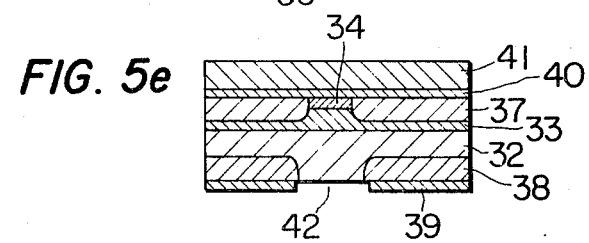

Further, as shown in FIG. 5e, that part of the ohmic contact electrode layer 39 which corresponds to a light extracting window 42 and the films 35 and 36 which have been employed as the diffusion mask are removed by the photo-lithograph respectively. At this time, the diffusion mask (films 35 and 36) on the n-side or on the upper side of the illustration is covered with apiezon in advance. After completion of the photo-lithographic treatment, the apiezon is removed with trichloro-ethylene, and the films 35 and 36 having been employed as the diffusion mask on the n-side (upper side) are successively removed. Subsequently, AuGe-Ni-Au 40 is evaporated on the upper surface of the resultant structure as an n-type ohmic contact electrode layer to a thickness of about 1 µm. Further, Au 41 being about 9 µm thick is deposited on the electrode layer 40 by the electrolytic plating.

Thereafter, the resultant structure in the state of a wafer is cut by scribing into the state of a chip of about 600 µm×600 µm. Then, a light emitting diode chip (hereinafter, abbreviated to "LED chip") as the light emitting device of this invention is obtained.

In a concrete example of the above embodiment, a GaAs substrate is used as the starting substrate, and the grown substance is obtained by growing a layer of a crystal mixed with the substrate material, the crystal being a crystal of another III-V element than used in forming the substrate, whereby the layer is a mixture of the III-V compound and the another III-V element, having a bandgap wider than that of the substrate. The step of providing the n+-type mixed crystal layer need not be carried out in some device structures to be fabricated.

Figure 6A:
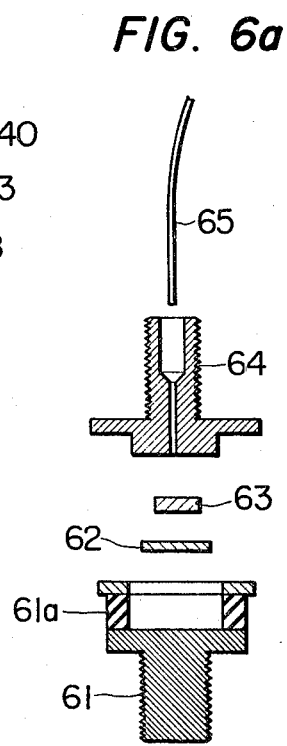
FIGS. 6a and 6b are views showing components necessary for assembling the light emitting device of this invention as a light emitting diode product, and the structure of the assembled and finished product, respectively.
Figure 6B:
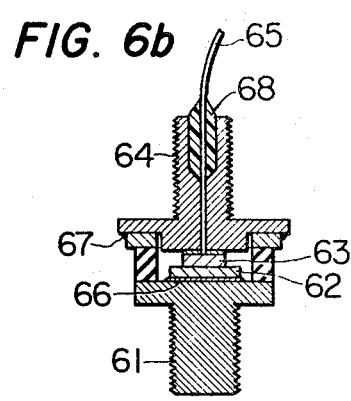

FIG. 6a and FIG. 6b are sectional views respectively showing components which are required for assembling a light emitting diode by the use of the LED chip described above, and the light emitting diode finished. In these figures, numeral 61 designates a stem having an insulating part 61a, numeral 62 a submount, numeral 63 the LED chip according to this invention, numeral 64 a fiber connector, and numeral 65 an optical fiber.

The sequence of assemblage is as stated below. First, the submount 62 and the LED chip 63 are bonded into an integral form. Subsequently, the submount 62 and the LED chip 63 in the integral form are bonded onto the lower surface of the fiber connector 64. The resultant structure is bonded into the stem 61 through a layer 66 of a low fusing metal such as indium, and the stem 61 and the fiber connector 64 are hermetically fixed with an epoxy resin 67. Thereafter, the optical fiber 65 is caused to pass through the fiber connector 64. The optical fiber 65 has its lower end face brought into close contact with the light extracting window of the LED chip 63, and is fixed to the fiber connector 64 with an epoxy resin 68.

After such assemblage, measurements were executed. As the result, characteristics to be mentioned below were obtained. The optical fiber 65 had a numerical aperture of 0.16, a core diameter of 85 µm, and a length of 50 cm. When a d.c. current of 100 mA was conducted, the optical fiber output was 350 µW on the average, the center wavelength of light emission was 8300 Å, and the spectral half-width was 270 Å. As the chip light output in the state in which the fiber was not attached, a considerably large value of 4-7 mW was obtained. The thermal resistance was as low as 30-50 deg./W.

In this case, the thermal resistance was low as mentioned above, and the heat radiation was favorably done, so that the saturation of the light output versus the increase of the bias current was little. When the bias current was 100 mA$_{0-p}$ and modulation depth was 40%, the modulation distortion of the light output was low to the extent of −50 dB. The Current-Voltage characteristics were also inspected. As the result, there was no leakage current, and such good characteristics as a forward voltage of 1.65 V ($I_F$=100 mA, d. c.) and a breakdown voltage of about 10 V were exhibited.

Further, the radiation region was measured. As the result, the radiation diameter was as extremely small as about 45 µm, and it was verified that the radiation region hardly spread from the area confined by the selective Zn diffusion layer 25 in FIG. 2. In this manner, according to this invention, the light emission of extraordinarily high radiance can be obtained from the very small area.

EMBODIMENT 3

Figure 7:
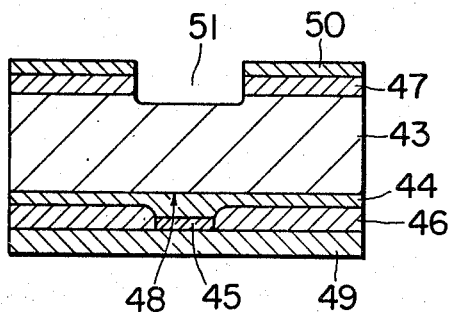
FIG. 7 is a view showing still another embodiment of the light emitting device of this invention.

FIG. 7 shows the sectional structure of a light emitting device according to another embodiment of this invention. A light extracting window 51 is formed in such a way that a portion corresponding to the light extracting window 28 in FIG. 2 is removed by the mask etching with an etchant of H$_2$SO$_4$-H$_2$O$_2$-H$_2$O. In case of this structure, a p+ region 47 in a p-type portion need not be formed by the selective diffusion, but it may be formed in such a way that after diffusion over the entire area of a wafer surface, the removal by the mask etching is carried out into a depth slightly greater than the diffusion depth, i.e., the mask-etched portion becoming slightly deeper than the diffused layer 47. The other steps of manufacture may be executed similarly to those illustrated in FIGS. 5a-5e.

An advantage in this case is that, by suitably selecting the diameter of the light extracting window 51 to be etched and removed, the coupling of the device with an optical fiber is done in a very good condition, so the troublesome operation of mask registration can be omitted. Needless to say, there is added the advantage that, by such deep etching and removal, the light output is enhanced to the amount of the component of light absorption by the removed portion.

In FIG. 7, numeral 43 indicates a p-conductivity type layer, numeral 44 an n-conductivity type layer, numeral 45 an n+-conductivity type layer, numerals 46 and 47 Zn diffused layers formed simultaneously, numeral 48 a p-n junction, numeral 49 an electrode layer for n-type ohmic contact, and numeral 50 an electrode layer for p-type ohmic contact.

Although, in the foregoing embodiments, only the case of employing Ga$_{1-x}$Al$_x$As (0<x≦1) as the semiconductor material has been stated, it is needless to say that similar effects are achieved with mixed crystals of other III-V compound semiconductors such as GaAs$_{1-x}$P$_x$ ($0<x\leq 1$), In$_x$Ga$_{1-x}$As ($0<x\leq 1$), GaAs$_{1-x}$Sb$_x$ ($0\leq x<1$) and Ga$_{1-x}$In$_x$P ($0\leq x<1$) or with hetero-junctions employing III-V compound semiconductor materials different from each other. The process of crystal growth is not restricted to the liquid phase growth, but a similar method of manufacture is applied and similar effects are achieved even by the vapor phase growth.

Further, although the above description has been made, for the brevity of explanation, of the embodiments of this invention in the case of fabricating the individual light emitting devices, this invention can of course be performed likewise to the foregoing cases even in case of fabricating a function element in which a large number of light emitting diodes are integrated on a single semiconductor substrate.

As set forth above, according to this invention, the radiation region of a p-n junction is confined to a very small area thereby to attain light emission of high radiance and high efficiency, a diffused layer of high carrier concentration is provided at a portion of contact with an electrode layer thereby to lower the contact resistivity, a portion of a light passage is left at a low carrier concentration thereby to reduce the absorption of light, and the coupling with an optical fiber can be easily conducted, so that the device of this invention is greatly effective as a light emitting device.

We claim:

1. A light emitting device having a III-V compound semiconductor substrate which has a predetermined conductivity type, a III-V compound first semiconductor layer which is deposited on an upper surface of said III-V compound semiconductor substrate and which has the opposite conductivity type to that of said substrate, wherein a p-n junction is formed between said semiconductor substrate and said first semiconductor layer, a current control semiconductor layer which has the opposite conductivity type to that of said first semiconductor layer and which covers an upper surface of said first semiconductor layer and which has a hole therethrough, a second semiconductor layer positioned in said hole and contacting said first semiconductor layer, whereby current can flow through said current control semiconductor layer, said second semiconductor layer having the same conductivity type as said first semiconductor layer, a first electrode which is provided directly on said current control semiconductor layer and said second semiconductor layer and which is in current flow communication with said first semiconductor layer through said second semiconductor layer, and a second electrode which is provided on a bottom surface of said semiconductor substrate and which has a light extracting window at its center part for emitting light from said device, said current control semiconductor layer being made of a layer of higher carrier concentration than the carrier concentration in the first semiconductor layer, whereby light is adapted to be emitted from a radiation region adjacent said p-n junction, normal to said p-n junction, which radiation region is confined by said current control semiconductor layer, and adapted to pass through the semiconductor substrate to said light extracting window, and wherein the bandgap of said semiconductor substrate is wider than that of said radiation region.

2. A light emitting device according to claim 1, wherein the carrier concentration of said current control semiconductor layer is sufficiently high so as to lower the contact resistivity between the current control semiconductor layer and said first electrode.

3. A light emitting device according to claim 2, including a further semiconductor layer between said semiconductor substrate and said second electrode, said further semiconductor layer having an aperture arranged to transmit the light and having a higher carrier concentration than the carrier concentration of the passage in the semiconductor substrate through which the light passes to the light extracting window.

4. A light emitting device according to claim 3, wherein the carrier concentration of said further semiconductor layer is sufficiently high so as to lower the contact resistivity between the semiconductor substrate and the second electrode.

5. A light emitting device according to claim 1, wherein said second semiconductor layer is an upper part of said first semiconductor layer, which upper part has been doped to provide a conductivity type impurity in excess therein.

6. A light emitting device according to claim 1, wherein said second semiconductor layer is a separate crystal layer, said crystal layer having a conductivity type impurity in excess therein.

7. A light emitting device according to claim 1, wherein said p-n junction is formed by either liquid phase epitaxial growth or vapor phase epitaxial growth.

8. A light emitting device according to claim 1, wherein said semiconductor substrate has a p-conductivity type, said first semiconductor layer has an n-conductivity type, and said second semiconductor layer has an n+-conductivity type.

9. A light emitting device according to claim 1, wherein said second electrode is provided directly on a bottom surface of said semiconductor substrate.

10. A light emitting device according to claim 5, wherein a bottom surface region of said semiconductor substrate covered by said second electrode is provided with a higher carrier concentration than the carrier concentration in the rest of the semiconductor substrate, with the second electrode contacting the bottom surface region provided with a higher carrier concentration, and wherein a depression, positioned corresponding, at the bottom surface of the semiconductor substrate, to the light extracting window, is formed in the bottom surface of said semiconductor substrate.

* * * * *